United States Patent
Lee et al.

(10) Patent No.: US 9,748,327 B2
(45) Date of Patent: Aug. 29, 2017

(54) PILLAR RESISTOR STRUCTURES FOR INTEGRATED CIRCUITRY

(71) Applicant: INTEL CORPORATION, Santa Clara, CA (US)

(72) Inventors: Chen-Guan Lee, Hillsboro, OR (US); Walid Hafez, Portland, OR (US); Chia-Hong Jan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/129,794

(22) PCT Filed: Jun. 18, 2014

(86) PCT No.: PCT/US2014/042865
§ 371 (c)(1),
(2) Date: Sep. 27, 2016

(87) PCT Pub. No.: WO2015/195109
PCT Pub. Date: Dec. 23, 2015

(65) Prior Publication Data
US 2017/0162646 A1    Jun. 8, 2017

(51) Int. Cl.
*G11C 11/00* (2006.01)
*H01L 45/00* (2006.01)
(Continued)

(52) U.S. Cl.
CPC .......... *H01L 28/20* (2013.01); *H01L 21/8234* (2013.01); *H01L 23/66* (2013.01); *H01L 27/0629* (2013.01)

(58) Field of Classification Search
CPC ...... H01L 28/20–28/66; H01L 27/0629; H01L 27/0635; H01L 27/11842; H01L 27/0738; H01L 21/8234
See application file for complete search history.

(56) References Cited

U.S. PATENT DOCUMENTS 5,254,493 A    10/1993   Kumar
6,130,137 A    10/2000   Prall
(Continued)

FOREIGN PATENT DOCUMENTS

WO    2013112291    8/2013

OTHER PUBLICATIONS

International Search Report and Written Opinion for International Patent Application No. PCT/US2014/042865, mailed on Mar. 16, 2015.
(Continued)

*Primary Examiner* — Evan Pert
*Assistant Examiner* — Changhyun Yi
(74) *Attorney, Agent, or Firm* — Green, Howard & Mughal LLP

(57) ABSTRACT

Integrated circuit structures including a pillar resistor disposed over a surface of a substrate, and fabrication techniques to form such a resistor in conjunction with fabrication of a transistor over the substrate. Following embodiments herein, a small resistor footprint may be achieved by orienting the resistive length orthogonally to the substrate surface. In embodiments, the vertical resistor pillar is disposed over a first end of a conductive trace, a first resistor contact is further disposed on the pillar, and a second resistor contact is disposed over a second end of a conductive trace to render the resistor footprint substantially independent of the resistance value. Formation of a resistor pillar may be integrated with a replacement gate transistor process by concurrently forming the resistor pillar and sacrificial gate out of a same material, such as polysilicon. Pillar resistor contacts may also be concurrently formed with one or more transistor contacts.

17 Claims, 11 Drawing Sheets

(51) Int. Cl.
    *H01L 49/02*     (2006.01)
    *H01L 27/06*     (2006.01)
    *H01L 21/8234*     (2006.01)
    *H01L 23/66*     (2006.01)

(56) References Cited

U.S. PATENT DOCUMENTS 6,376,909 B1     4/2002  Forbes
2011/0170331 A1*  7/2011  Oh ..................... G11C 13/0002
                                          365/148

OTHER PUBLICATIONS

Taiwanese Search Report mailed Mar. 21, 2016, for TW Patent Application No. 104114889.
International Preliminary Report on Patentability for PCT/US2014/042865 mailed Dec. 29, 2016, 7 pages.

* cited by examiner ial Phase Application of, and
PILLAR RESISTOR STRUCTURES FOR INTEGRATED CIRCUITRY

CLAIM OF PRIORITY

This application is a National Phase Application of, and claims priority to, PCT Application No. PCT/US14/42865, filed on Jun. 18, 2014, titled "PILLAR RESISTOR STRUCTURES FOR INTEGRATED CIRCUITRY", which is incorporated by reference in its entirety for all purposes.

TECHNICAL FIELD

Embodiments of the invention generally relate to fabrication of integrated circuits (ICs) and monolithic devices, and more particularly pertain to resistor structures.

BACKGROUND

Monolithic ICs generally comprise a number passive devices, such as resistors, and/or active devices, such as metal-oxide-semiconductor field-effect transistors (MOSFETs), or the like, fabricated over a substrate. FIG. 1A is a plan view of a conventional monolithic planar resistor 110 disposed over a substrate isolation dielectric 106. FIG. 1B is a cross-sectional view of conventional planar resistor 110. With active device dimensions scaling down from one technology generation to the next, it is desirable to also scale down the footprint of resistors within the IC. In planar resistor 110, most of voltage drop is along a plane parallel to the substrate (e.g., x direction in FIG. 1A, 1B) as highly resistive contacts are disadvantageous from a standpoint of manufacturability and/or parametric control, etc. Current density constraints may limit reductions in the cross-sectional area of a resistor, for example limiting reductions in the thickness $T_f$ for planar resistor 110. With the lateral length of planar resistor 110 dominated by the sheet resistance of the material utilized, the resistor footprint is a strong function of the resistance value needed for a given circuit. Therefore, from one fabrication technology generation to the next, circuit design constraints may prevent planar resistor 110 from achieving significant area scaling. Resistor structures that offer greater scalability are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
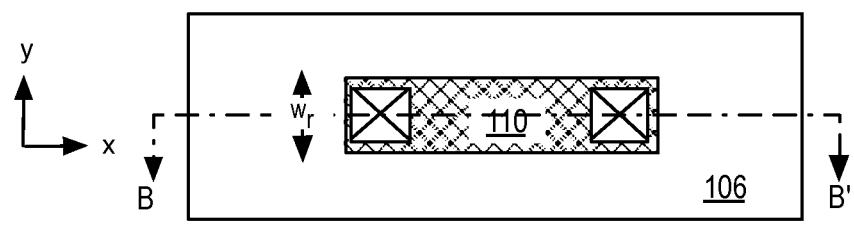
FIG. 1A is a plan view of a conventional planar resistor.
Figure 1B:
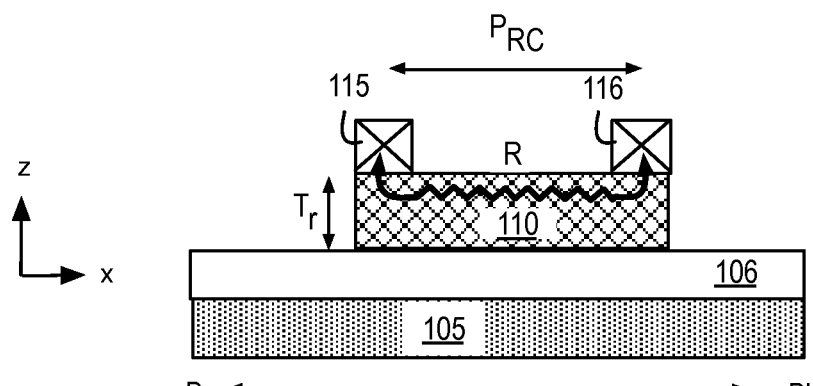
FIG. 1B is a cross-sectional view of the conventional planar resistor illustrated in FIG. 1A.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or to "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Integrated circuit structures including a pillar resistor disposed over a surface of a substrate, and fabrication techniques to form such a resistor in conjunction with fabrication of a transistor are described herein. Following embodiments, a small resistor footprint may be achieved by orienting the resistive length of a resistor orthogonally to the substrate surface. Such a vertically-oriented resistor "pillar" may complement myriad 3-D IC architectures, such as the finFET, and stacked memory, etc. A significant benefit of building both active and passive devices in the "z-direction" is substrate area scaling, which is a measure on the x-y plane, for example. In embodiments, the resistor pillar is disposed over a first end of a conductive trace, a first resistor contact is further disposed in contact with the pillar, and a second resistor contact is disposed in contact with a second end of a conductive trace to render the resistor footprint substantially independent of the resistance value, and instead predominantly dependent on contact scaling. Resistor contact dimensions are able to scale in step with transistor contact scaling. In advantageous embodiments, resistor pillar fabrication may be integrated with replacement gate transistor (finFET or planar) processes by concurrently forming the resistor pillar and sacrificial gate out of a same material, such as polysilicon. Pillar resistor contacts may be further formed concurrently with one or more transistor contacts.

Figure 2A:
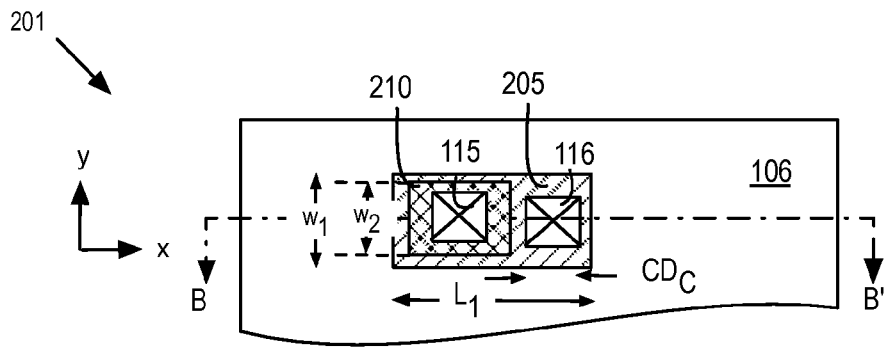
FIG. 2A is a plan view of a pillar resistor, in accordance with an embodiment.
Figure 2B:
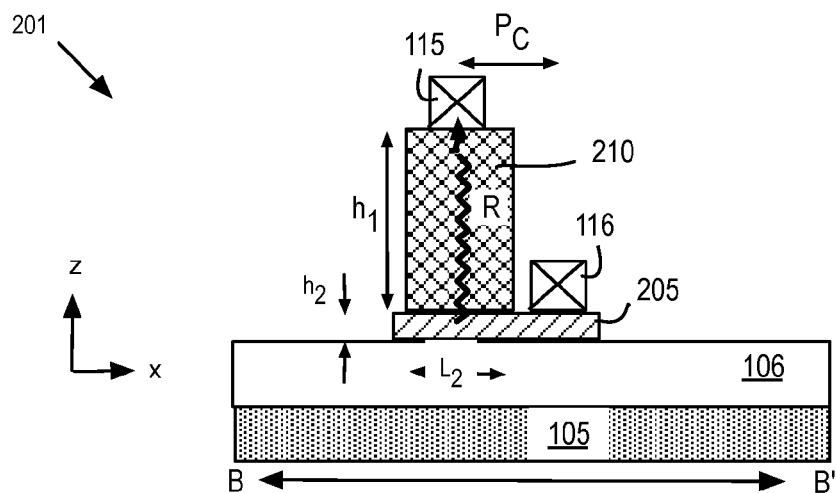
FIG. 2B is a cross-sectional view of the pillar resistor illustrated in FIG. 2A, in accordance with an embodiment.
Figure 2C:
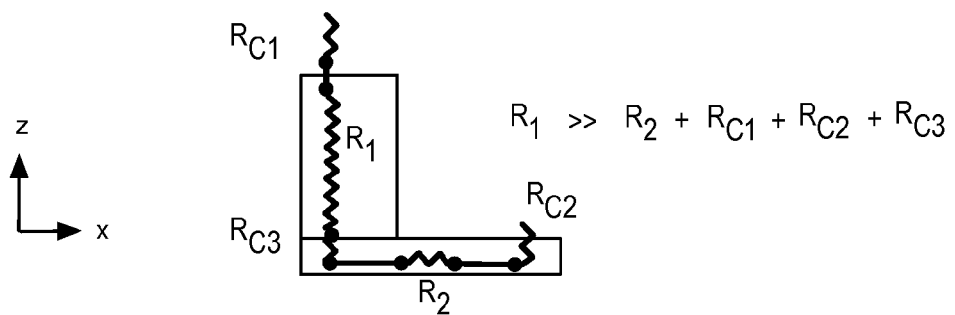
FIG. 2C is a circuit schematic depicting components of the resistance value of the pillar resistor illustrated in FIG. 2A, in accordance with an embodiment.

FIG. 2A is a plan view of a pillar resistor 201, in accordance with an embodiment. FIG. 2B is a cross-sectional view of the pillar resistor 201 along the b-b' plane illustrated in FIG. 2A, in accordance with an embodiment. FIG. 2C is a circuit schematic depicting resistive components of the pillar resistor 201, which sum to a resistance value in accordance with an embodiment. As shown in FIGS. 2A and 2B, a conductive trace 205 is disposed over a substrate 105, with an intervening isolation dielectric material 106. In addition to pillar resistor 201, one or more active devices (not depicted), such as transistors (e.g., MOSFETs), photodetectors (e.g., PIN diodes), lasers, modulators, and the like may be similarly disposed in, on, or over substrate 105. In addition to pillar resistor 201, one or more other passive device, such as a capacitors, inductors, optical waveguides, and the like may also be disposed in, on, or over substrate 105.

Substrate 105 may be any substrate suitable for forming a monolithically integrated electrical, optical, or microelectromechanical (MEM) device, generally referred to herein as an IC. Exemplary substrates include a semiconductor substrate, semiconductor-on-insulator (SOI) substrate, an insulator substrate (e.g., sapphire), or the like, and/or combinations thereof. In one exemplary embodiment, substrate 105 comprises a substantially monocrystalline semiconductor, such as, but not limited to, silicon. Exemplary semiconductor substrate compositions also include germanium, or group IV alloy systems, such as SiGe; group III-V systems, such as GaAs, InP, InGaAs, and the like; or group III-N systems, such as GaN.

Isolation dielectric material 106 may be any dielectric material known in the art to be suitable for electrically isolating conductive trace 205 from substrate 105. Many such materials are in use, such as, but not limited to, silicon oxides (SiO), silicon nitrides (SiN), silicon oxynitrides (SiON), silicon carbonitrides (SiCN), and low-k materials (e.g., carbon doped silicon dioxide (SiOC), porous dielectrics, etc.).

Conductive trace 205 may be a conductive line, or pad, etc. As illustrated in FIG. 2B, a top surface of the portion of dielectric material 106 outside of, or beyond, the lateral dimension conductive trace 205 is non-planar with a top surface of conductive trace 205. In alternate embodiments, conductive trace 205 may be embedded within dielectric 106, with top surfaces of conductive trace 205 being either planar with or covered over by dielectric material 106. Conductive trace 205 may include any conductive material suitable for providing a reasonably low resistance lateral conduction path and/or provide a land for contacts of suitably low resistance. In exemplary embodiments, conductive trace 205 includes a heavily doped semiconductor and/or metal composition. Exemplary semiconductors include silicon, germanium, and silicon germanium. While such semiconductor may be monocrystalline or amorphous, in the exemplary embodiment the semiconductor is polycrystalline. Doping of conductive trace 205 may depend upon the semiconductor material system and may render the conductive trace 205 n-type or p-type. In one exemplary embodiment where conductive trace 205 is polysilicon, the impurity is p-type (e.g., Boron). Impurity dopant level is a function of the desired sheet resistance and may for example be in the range of $10^{17}$-$10^{19}$/cm$^3$. In other embodiments where conductive trace 205 is a metal, the metal composition may be any known with suitably low sheet resistance and/or low contact resistance, such as, but are not limited to, copper (Cu), cobalt (Co), tungsten (W), titanium (Ti), aluminum (Al), platinum (Pt), nickel (Ni), and alloys thereof.

Conductive trace 205 has lateral dimensions of $W_1$ and $L_1$, which define the lateral footprint (i.e., substrate area) of pillar resistor 201. Length $L_1$ is advantageously minimized to reduce the resistor footprint. In an exemplary embodiment, length $L_1$ is sized to just accommodate two resistor contacts 115, 116 of minimum contact dimension $CD_C$, and minimum pitch $P_C$ according to the design rule for the given material layer. As contact dimensions and contact pitch scale with technology, these values can be expected to change over time with an exemplary range of $CD_A$ and $P_C$ each being 10-30 nm. Width $W_1$ is advantageously minimized to reduce footprint, and in an exemplary embodiment, width $W_1$ is sized to just accommodate contacts 115, 116 of minimum contact dimension $CD_C$. In other embodiments, $W_1$ may be increased beyond minimum contact dimension $CD_C$, to accommodate misregistration or increase conductive cross-section of conductive trace 205. Conductive trace 205 has a z-height $h_2$, associated with its film thickness that may vary as a function of the resistance desired. In an exemplary polysilicon embodiment, $h_2$ may vary between 10 and 50 nm, have a width $W_1$, and be doped to a level for conductive trace 205 to have an electrical resistance of no more than 100 ohms.

In embodiments, a pillar of resistive material 210 is disposed in contact with a first end of conductive trace 205. Resistive material 210 may be of any known material having a controllable sheet resistance in the desired range and otherwise compatible with substrate processing. In embodiments, resistive material 210 has a greater sheet resistance than does conductive trace 205. In further embodiments resistive material 210 includes a semiconductor, such as, but not limited to, silicon, germanium, or a silicon-germanium alloy. In one exemplary embodiment where conductive trace 205 includes polysilicon, resistive material 210 is also polysilicon, but is doped to a lower level than is conductive trace 205 (e.g., resistive material 210 may not be intentionally doped). In other embodiments resistive material 210 includes a metal or metal alloy known to be suitable for thin film resistor applications, such as, but not limited to, tantalum, tungsten, aluminum, nickel, titanium, cobalt, their alloys, nitrides, and carbides.

The pillar of resistive material 210 extends a first z-height $h_1$ from the first end of conductive trace 205 (along z-axis). As described further elsewhere herein, z-height $h_1$ is a function of the resistive material film thickness. As illustrated in FIG. 2C, the electrical resistance $R_1$ scales with the z-height $h_1$ for a given resistive material so that a z-height $h_1$ may be selected for a designed resistor resistance value based on the resistive material selected. In certain exemplary embodiments wherein z-height $h_2$ is less than 50 nm (e.g., 25 nm), z-height $h_1$ is in the range of 50-200 nm. In embodiments, z-height $h_1$ may be greater than a lateral length $L_2$ of the pillar interfacing with conductive trace 205. In further embodiments, z-height $h_1$ is greater than the sum of lateral length $L_2$ and the lateral length of resistor contact 116 (i.e., Ca). In still further embodiments, z-height $h_1$ is greater than lateral length $L_1$ of conductive trace 205, which is further a function of the spacing between resistive material 210 and resistor contact 116.

Electrical resistance $R_1$ also scales with lateral width $w_2$ of the pillar of resistive material 210. In the exemplary embodiment, $w_2$ is substantially equal to the critical dimension of resistor contact 115 e.g., (e.g., $CD_c$) At this minimum lateral width $w_2$, a resistance $R_1$ may be achieved for a given z-height $h_1$. This z-height may be set to be a maximum designed resistor value. Lower resistance values may be achieved for resistors fabricated to the same z-height $h_1$ by increasing lateral width $w_2$ so that the vertical resistor has a resistance value that is still lithographically definable. In certain embodiments therefore, an array of vertical resistors spanning a range of a lateral dimensions may provide a range of resistance values (e.g., for trimming, etc.). In this manner, resistors with a resistance value lower than some designed value may incur a footprint penalty rather than footprint scaling up with increasing resistor values.

Figure 2D:
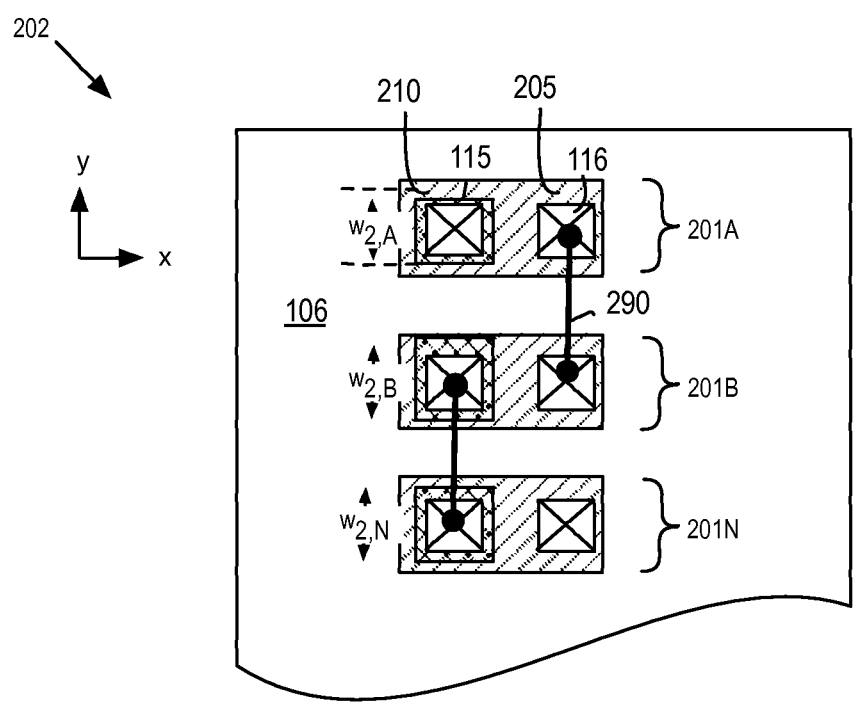
FIG. 2D is a plan view of a series connection of pillar resistors, in accordance with an embodiment.

In further embodiments, as illustrated in FIG. 2D, a pillar resistor series 202 includes a plurality of interconnected pillar resistor structures 201A, 201B, 201N, each having the attributes of pillar resistor structure 201. Pillar resistors are linked together by an upper level interconnect metallization 290, for example to provide a resistance value exceeding a designed maximum resistance of pillar resistor structure 201. A single mask defining the interconnect metallization 290 may be varied to link a very large array of vertical resistors together to form any number of resistor networks. The pillar resistor links 201A, 201B, 201N may all have the same fixed z-height ($h_1$) to incrementally increase a total resistance value with each interconnection. With each linked pillar resistor able to have a resistor pillar of arbitrary lithographically defined lateral width $w_2$, any total resistance value may be achieved with a discrete number of pillar resistors (e.g., by varying $w_{2a}$, $w_{2b}$, $w_{2n}$ independently).

Returning to FIGS. 2A and 2B, resistor contact 115 is disposed in contact with pillar 210 and separated from conductive trace 205 by the z-height $h_1$. A second resistor contact 116 is disposed in contact with a second end of conductive trace 205. Resistor contacts 115, 116 may be known material(s) with contact 115 advantageously providing ohmic contact to resistor pillar 210 and contact 116 advantageously providing ohmic contact to conductive trace 205. In one embodiment, resistor contacts 115, 116 are of a same material composition. In further embodiments, resistor contacts 115, 116 are of the same metal composition, such as, but not limited to any metal, or metal alloy known to be suitable for transistor contacts.

As shown in FIG. 2C, the electrical resistance value associated with a current passed between contacts 115, 116 is a function of the resistance of resistive material 210 ($R_1$), resistance of conductive trace 205 ($R_2$), resistance of contact 115 ($R_{c1}$), resistance of contact 116 ($R_{c2}$), and resistance of contact between resistive material 210 and conductive trace 205 ($R_{c3}$). Resistive voltage drop is to occur predominantly along the z-dimension as a strong function of resistive material z-height $h_1$. In embodiments, the electrical resistance contribution of resistive material 210 is more than twice the sum of the conductive trace resistance $R_2$, first contact resistance $R_{c1}$, second contact resistance $R_{c2}$, and third contact resistance $R_{c3}$. In further embodiments, the electrical resistance contribution of resistor pillar 210 is more than three times the sum of: the conductive trace resistance $R_2$; first resistor contact resistance $R_{c1}$; second resistor contact resistance $R_{c2}$; and third contact resistance $R_{c3}$. In particular embodiments where both resistor pillar 210 and conductive trace 205 are polysilicon (the latter being impurity doped for lower resistance), $R_1$ is at least 2000Ω for a resistor pillar 210 having a z-height $h_1$ of at least 50 nm while the sum of $R_2$, $R_{c1}$, $R_{c2}$, and $R_{c3}$ is no more than 500Ω. In certain such embodiments, conductive trace 205 has an electrical resistance of no more than 100Ω for a material z-height (thickness) $h_2$ of no more than 50 nm.

Figure 3A:
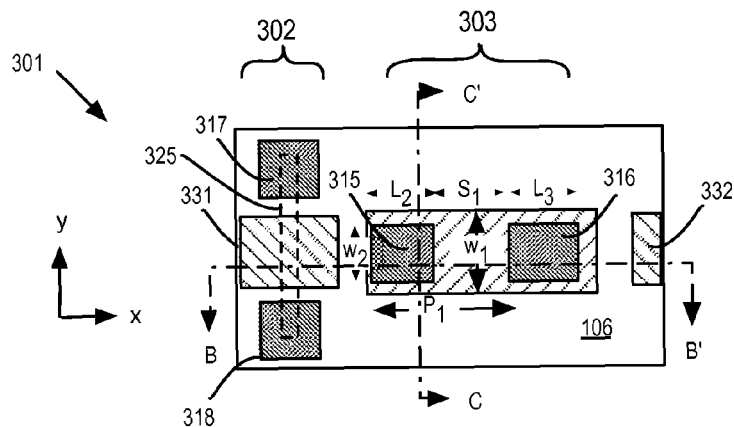
FIG. 3A is a plan view of an integrated circuit structure including a transistor and a pillar resistor, in accordance with an embodiment.
Figure 3B:
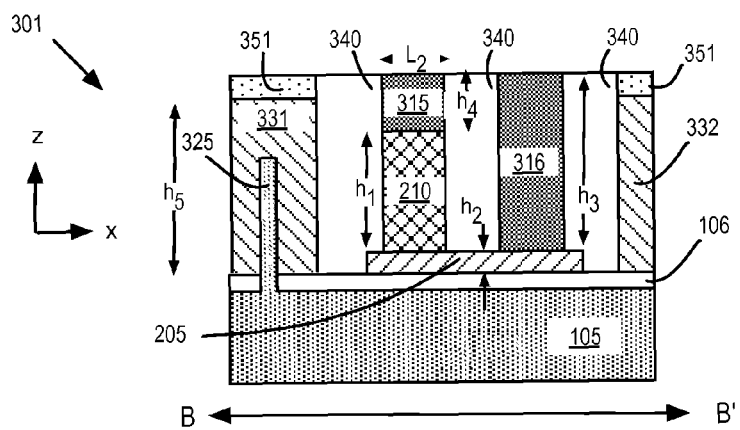
FIG. 3B is a first cross-sectional view of integrated circuit structure illustrated in FIG. 3A, in accordance with an embodiment.
Figure 3C:
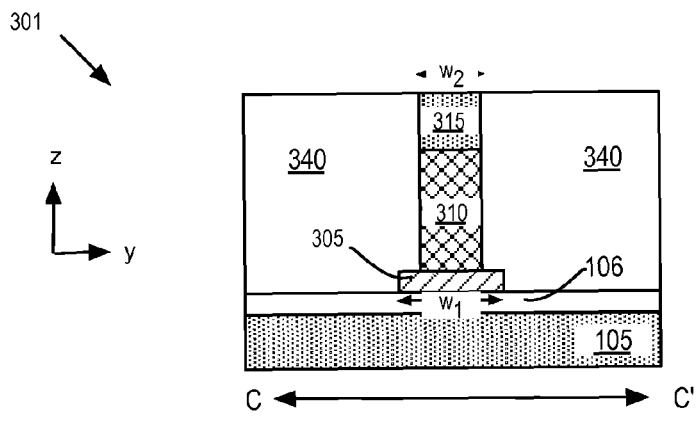
FIG. 3C is a second cross-sectional view of integrated circuit structure illustrated in FIG. 3A, in accordance with an embodiment.

FIG. 3A is a plan view of an integrated circuit structure 301 including a transistor 302 and a pillar resistor 303, in accordance with an embodiment. FIG. 3B is a first cross-sectional view of integrated circuit structure 301 along the b-b' line illustrated in FIG. 3A, in accordance with an embodiment. FIG. 3C is a second cross-sectional view of integrated circuit structure 301 along the c-c' line illustrated in FIG. 3A, in accordance with an embodiment. Pillar resistor 303 includes a pillar of resistive material 210 in physical and electrical contact with resistor contact 315 and conductive trace 205. Conductive trace 205 is further in physical and electrical contact with resistor contact 316. Resistive material 210 may have any or all of the attributes described above in the context of FIG. 2A-2C. Likewise, resistor contacts 315, 316 may each have any or all of the attributes described above for resistor contacts 215, 216. Conductive trace 205 may also have any or all of the attributes described above in the context of FIG. 2A-2C. Pillar resistor 303 therefore further specifies additional embodiments of pillar resistor 201.

As shown in FIG. 3B, pillar resistor 303 includes substantially planar resistor contacts 315, 316, which have top surfaces planar with each other. As such, resistor contact 316 has a z-dimension z-height $h_3$ from conductive trace 205 that is substantially equal to the sum of the resistive material z-height $h_1$ and a z-dimension z-height $h_4$ of the first resistor contact 315. With a low resistance material employed for resistor contact 316, resistive drop along $h_3$ is negligible as it would be for any filled via of comparable vertical dimension. As further illustrated in FIGS. 3A and 3B, resistor contact 315 interfaces with the entire top surface area of the pillar of resistive material 210 and has a lateral length $L_2$ substantially equal to that of the pillar interface with conductive trace 205. With contact 315 landing on the full cross-section of the pillar, contact resistance associated with contact 315 may be minimized for a pillar of resistive material having a cross-sectional area that is a function of a minimum lateral dimension $L_2$. Of further note, contact 315 is perfectly aligned to the pillar of resistive material 210 such that the footprint of contact 315 is coincident with the footprint of resistive material 210. As all known lithographically-based patterning processes incur some inherent overlay error, contact 315 is best described as belonging to a class of structures referred in the art as "self-aligned." Contact 315 is "self-aligned" to resistive material 210, as described further elsewhere herein, which permits advantageous lateral scaling of IC structure 301. In certain embodiments, resistive material 210 and/or contact 316 may rely on photolithographic pattern alignment to conductive trace 205 (i.e., "non-self-aligned"). In the exemplary embodiment illustrated in FIGS. 3A, 3B, and 3C, both resistive material 210 and contact 316 are fully landed upon conductive trace 205 to ensure low corresponding contact resistances. For a complete land, conductive trace 205 may have a lateral width $w_1$ that is larger than width $w_2$ of resistive material 210 (and contact 315), and a lateral length $l_1$ that is larger than the sum of lateral length $l_2$ of resistive material 210, lateral length $l_3$ of contact 316, and intervening space $s_1$. Contact misregistration exceeding the lateral dimensions of conductive trace 205 may be expected to increase contact resistance.

In embodiments, transistor 302 is a MOSFET including a semiconductor channel disposed under a gate stack with semiconductor source/drain regions disposed on opposite sides of the channel. In the exemplary embodiment shown in FIGS. 3A, 3B, and 3C, transistor 302 includes one or more non-planar semiconductor body 325 extending from substrate 105. Semiconductor body 325 may therefore be of the same substantially monocrystalline semiconductor as substrate 105 (e.g., silicon). Although a finFET is exemplified in FIGS. 3A, 3B, and 3C, pillar resistors may also be integrated with planar transistors in substantially the same manner described herein. Semiconductor body 325 further includes a first source/drain region at a first end of non-planar semiconductor body 325 in electrical contact with a first source/drain contact 317. Semiconductor body 325 further includes a second source/drain region at a second end of non-planar semiconductor body 325 in electrical contact with a second source/drain contact 318. Semiconductor body 325 further includes a channel region between the two source/drain regions. In embodiments, the pair of source/drain contacts 317, 318 have substantially the same composition as the first and second resistor contacts 315, 316. In the exemplary embodiment illustrated, top surfaces of source/drain contacts 317, 318 are also planar with top surfaces of resistor contacts 315, 316.

As further illustrated in FIGS. 3A and 3B, a gate electrode 331 is disposed over the channel portion of semiconductor body 325. A gate dielectric (not illustrated) is disposed between gate electrode 331 and semiconductor body 325 to complete the gate stack and enable capacitive coupling of the channel to gate electrode 331. A second gate electrode 332 is further illustrated in FIG. 3A, 3B to exemplify how pillar resistor 303 may be disposed among a plurality of transistors. Gate electrode 331 extends a z-height $h_5$ from a top surface of isolation dielectric 106. In embodiments, the resistive material pillar z-height $h_1$ is not greater than the gate electrode z-height $h_5$. In further embodiments, gate electrode z-height $h_5$ is not less than the sum of the resistive material pillar z-height $h_1$ and the conductive trace z-height $h_2$, and not greater than the sum of the resistive material pillar z-height $h_1$, the conductive trace z-height $h_2$, and contact z-height $h_4$. In advantageous embodiments where resistive material 210 also serves a sacrificial gate electrode material (e.g., in a gate replacement process described further elsewhere herein) and contact 315 is self-aligned to resistive material 210, gate electrode z-height $h_5$ is greater than sum of pillar z-height $h_1$ and conductive trace z-height $h_2$.

As illustrated in FIGS. 3B and 3C, resistor contact 315 is surrounded by an isolation dielectric 340. Resistor contact 315 is similarly surround by isolation dielectric 340 that fills space $s_1$ (FIG. 3A) to electrically isolate the resistor contacts 315, 316 which may otherwise electrically shunt resistive material 210. Isolation dielectric 340 further spaces gate electrode 331 from resistive material 210, electrically insulating transistor 302 from pillar resistor 303. Isolation dielectric 340 further spaces gate electrode 332 from resistor contact 316 and/or conductive trace 205, electrically insulating the gate electrode 332 from pillar resistor 303. In the exemplary embodiment, gate capping dielectric 351 is disposed over gate electrode 331, planarizing the gate stack with the top surface of resistor contacts 315, 316. In one embodiment, isolation dielectric 340 and gate capping dielectric 351 are distinct materials allowing for etch selectively between the two materials. Either or both of isolation dielectric 340 and gate capping dielectric 351 may be of a composition distinct from isolation dielectric 106 allowing for etch selectively between the materials. In exemplary embodiments, either or both of isolation dielectric 340 and gate capping dielectric 351 includes one or more of: SiO, SiON SiN, SiCN, SiC, low-k dielectric (e.g., carbon-doped oxide), or the like.

Figure 4A:
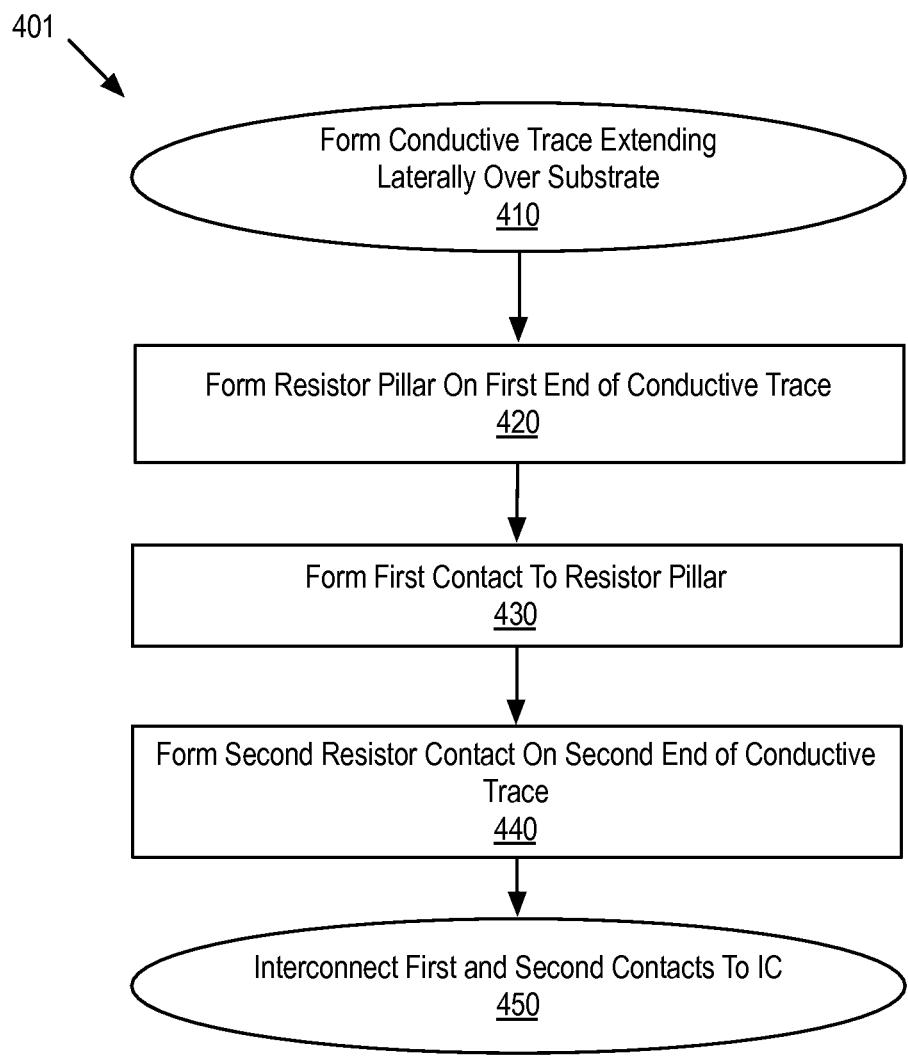
FIG. 4A is a flow diagram illustrating a method of forming a pillar resistor, in accordance with an embodiment.

Pillar resistors and IC structures incorporating them may be fabricated with a wide variety of techniques. FIG. 4A is a flow diagram illustrating a method 401 for forming a pillar resistor, in accordance with one exemplary embodiment. Method 401 may be practiced to fabricate the pillar resistor 201 illustrated in FIGS. 2A, 2B, or pillar resistor 303 illustrated in FIGS. 3A, 3B, for example.

Method 401 begins at operation 410 where a conductive trace or interconnect feature extending laterally over a substrate is formed, for example over or within an insulating dielectric material. Any fabrication technique may be utilized at operation 401. For example, a conductive material film may be deposited, a photoresist deposited over the conductive film, and the photoresist lithography patterned to mask a portion of conductive film. The unmasked portion of conductive film may be etched to clear and the mask removed.

Method 401 then proceeds to operation 420 where a resistive material film is deposited over the conductive trace formed at operation 410. Any deposition processes, such as, but not limited a chemical vapor deposition (CVD), plasma enhanced CVD (PECVD), physical vapor deposition (PVD), atomic layer deposition (ALD), or the like may be utilized to deposit the resistive material, for example to a film thickness of at least 50 nm. Also at operation 420, the resistive material film is patterned, for example with one or more photolithographic masking and etch process. A resistor pillar mask may be aligned to the conductive trace formed at operation 410. Unmasked resistive material may then be etched to clear leaving a pillar of resistive material landed upon a portion (e.g., a first end) of the conductive trace. Optionally, before patterning the pillar, a recess of 10-50 nm may be etched into the resistive material film in alignment with the conductive trace formed at operation 410. This recess may then be backfilled with a dielectric material, planarized with the resistive material film, and the pillar then etched in a self-aligned manner with the dielectric material serving as a mask during the pillar etch.

At operation 430, a contact is formed to the resistor pillar. Another contact is further formed to a second end of the conductive trace at operation 440. Operations 430 and 440 may be performed in any order, or concurrently. In one embodiment where the pillar etch was performed with a dielectric mask, an isolation dielectric is deposited over the dielectric-masked pillar, for example by any known CVD or a spin-on process. If the isolation dielectric deposition process employed is not self-planarizing, the isolation dielectric may then be planarized with the dielectric mask on the resistor pillar using any planarization technique (e.g., chemical-mechanical polish). The dielectric mask on the pillar may then be removed to expose the pillar. Contact metal may then be backfilled onto the pillar and planarized with the isolation dielectric. In another embodiment, a self-aligned contact to the resistor pillar may be formed by first depositing an isolation dielectric over a unmasked resistor pillar, again by any known CVD or a spin-on process. If the isolation dielectric deposition process employed is not self-planarizing, the isolation dielectric may then be planarized with the resistor pillar using any planarization technique (e.g., chemical-mechanical polish). The resistor pillar may then be recessed by 10-50 nm relative to the isolation dielectric, for example with a selective etch process so that the pillar z-height is between 50 and 200 nm. Contact metal may then be backfilled into the resistor pillar recess.

The contact metal may be planarized with a surrounding isolation dielectric to confine the contact metal to within only the resistor pillar. In a further embodiment, a contact to the conductive trace may be formed by further patterning the resistive material (e.g., at operation 420) into a sacrificial pillar disposed over a second end of the conductive trace. This patterning may be performed concurrently with patterning of the resistor pillar. The isolation dielectric may then be deposited over the sacrificial pillar concurrently with the resistor pillar. The sacrificial pillar may then be subsequently removed selectively to the isolation dielectric to expose the second end of the conductive trace. Contact metal may then be backfilled into the opening left by removal of the sacrificial pillar. Planarization of contact metal with the isolation dielectric then also confines the contact metal to a within a via electrically isolated from the resistor pillar. Method 401 then completes with interconnecting the resistor contacts to other components of an IC formed over the substrate, such as but not limited to a MOSFET gate electrode, MOSFET source/drain, or other resistors.

Figure 4B:
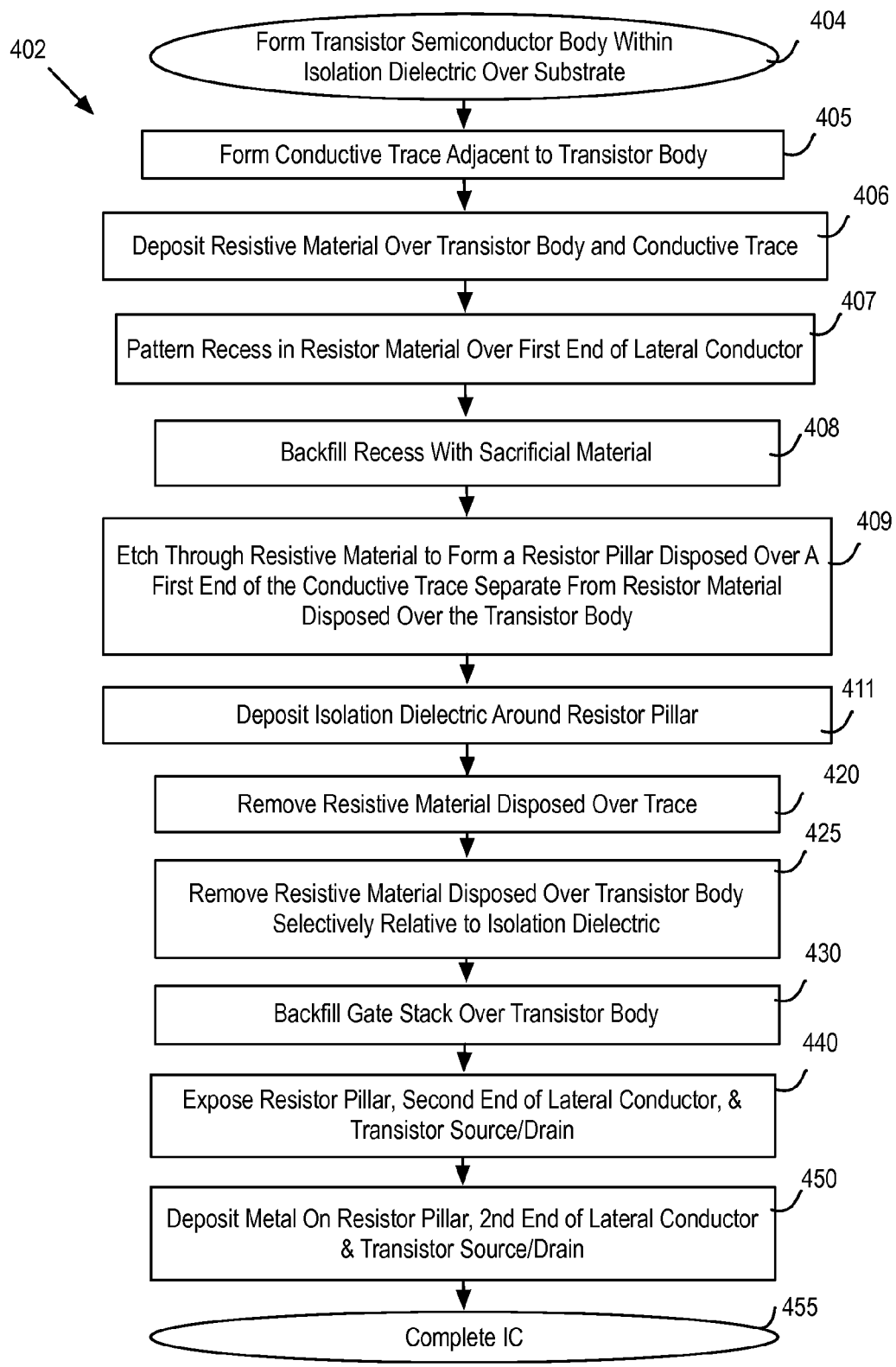
FIG. 4B is a flow diagram illustrating a method of forming an IC interconnect structure including a transistor and a pillar resistor, in accordance with an embodiment.

FIG. 4B is a flow diagram illustrating a method 402 for forming an IC structure including a MOSFET and resistor pillar, in accordance with a specific embodiment of method 401. Certain operations described in the context of method 401 are described in further detail for the exemplary embodiment illustrated in FIG. 4B. FIGS. 5A, 5B, 5C, 5D, 5E, 5F, 5G and 5H are cross-sectional views of an IC structure including a FET and resistor pillar evolving as selected operations in method 402 are performed, in accordance with advantageous embodiments. Reference numbers introduced in FIGS. 2A, 2B, 3A, 3B, and 3C are retained for corresponding structures further illustrated in FIG. 5A-5H.

Referring to FIG. 4B, method 402 begins at operation 404 where a transistor semiconductor body is formed within an isolation dielectric disposed over a substrate. In the example shown in FIG. 5A, a non-planer semiconductor body, or fin, 325 is etched into substrate 105. Semiconductor body 325 and substrate 105 may be, for example, substantially monocrystalline silicon, or any other semiconductor material system suitable for formation of a transistor, such as any of those described above. As further illustrated semiconductor body 325 extends through an isolation dielectric 106, which for example may have been deposited over semiconductor body 325, planarized with a top surface of semiconductor body 325, and then recessed using conventional techniques to expose a desired fin z-height.

Figure 5A:
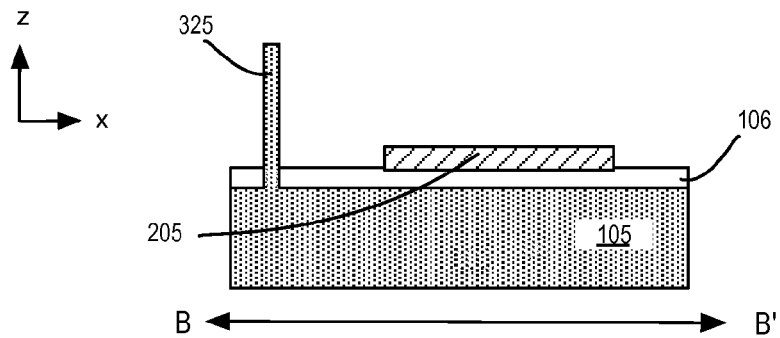
FIGS. 5A, 5B, 5C, 5D, 5E, 5F, 5G, and 5H are cross-sectional views of an IC structure including a transistor and a pillar resistor evolving as selected operations in the method depicted in FIG. 4B are performed, in accordance with an embodiment.
Figure 5B:
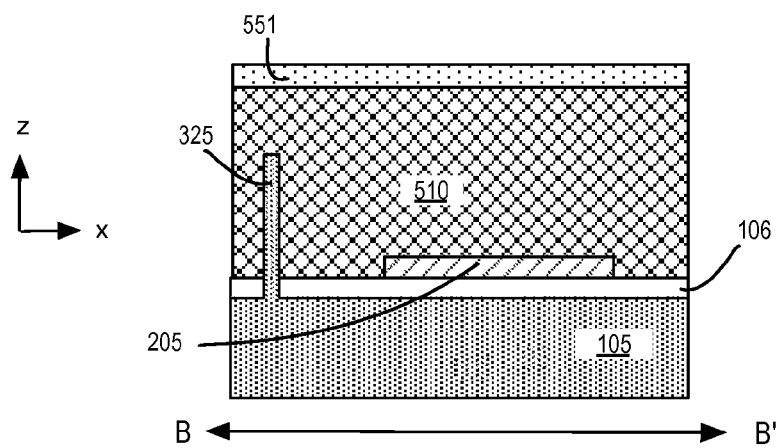
Figure 5C:
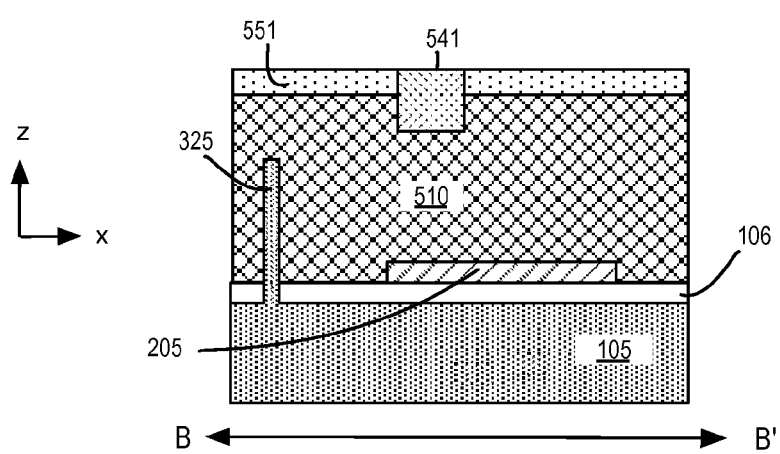

Returning to FIG. 4B, at operation 405 a conductive trace is formed adjacent to the transistor semiconductor body that was formed at operation 404. FIG. 5B illustrates an exemplary conductive (low resistance) thin film deposited over isolation dielectric material 106 using any conventional technique, such as, but not limited to PVD, CVD, or ALD. In one exemplary embodiment polysilicon is deposited by CVD. The polysilicon is doped in-situ or ex-situ to a desired low resistivity. The conductive thin film is then patterned, for example with conventional photolithography and etch techniques to form conductive trace 205 extending laterally over a portion of substrate 105. Any etch suitable for the conductive thin film may be utilized. In one advantageous embodiment where the conductive thin film is doped polysilicon and semiconductor body 325 comprises silicon, a wet etch process that etches doped (e.g., boron-rich) polysilicon preferentially over (i.e., selectively to) undoped, more lightly doped, or complementarily doped, silicon is employed to pattern conductive trace 205.

Returning to FIG. 4B, method 402 continues at operation 406 where a resistive material is deposited over the transistor semiconductor body formed at operation 404, and over the conductive trace formed at operation 405. In the exemplary embodiment illustrated in FIG. 5B, a resistive material 510 (e.g., polysilicon doped to a target resistivity) is deposited, for example to a thickness of at least 50 nm over semiconductor 325 and over conductive trace 205. As described further below, for embodiments where resistive material 510 is to further serve as a sacrificial transistor gate in a gate replacement process, resistive material 510 may be deposited to a thickness exceeding 200 nm, as permitted by constraints on the sacrificial gate, enabling a pillar resistor to have larger maximum resistance for a given lateral pillar dimension. In one exemplary embodiment, polysilicon is deposited by CVD to a thickness exceeding 50 nm, and advantageously exceeding 75 nm. The polysilicon is doped in-situ or ex-situ to a desired resistivity, for example higher than that of conductive trace 205. Resistive material 510 is planarized and capped with a dielectric hardmask 551, such as SiON, SiN, SiO, SiC, SiCN, SiOC, or the like.

Returning to FIG. 4B, at operation 407 the resistive material is patterned and a recess formed over (i.e., in alignment with) the conductive trace formed at operation 405. In one exemplary embodiment, a conventional photolithography operation patterns a mask with an opening aligned to an end of the conductive trace. The exposed portion of the dielectric hardmask is etched through and a portion of the resistive material thickness is removed to form the recess. At operation 408 the resistive material recess formed at operation 407 is backfilled with a sacrificial material. In the exemplary embodiment further illustrated in FIG. 5C, sacrificial fill material 541 is deposited in the recess etched into resistive material 510. Sacrificial fill material 541 may be any material, such as SiON, SiN, SiO, or the like, that can be subsequently removed with adequate selectively over resistive material 510. In one such embodiment, the sacrificial material backfilled at operation 408 is of has a composition distinct from that of dielectric hardmask 551. Any conventional deposition process, such as CVD, ALD, or a self-planarizing spin-on process may be utilized to form sacrificial fill material 541. If the sacrificial material deposition was not self-planarizing, a planarization operation may be subsequently performed to limit sacrificial fill material 541 to the physical confines of the recess within resistive material 510.

Figure 5D:
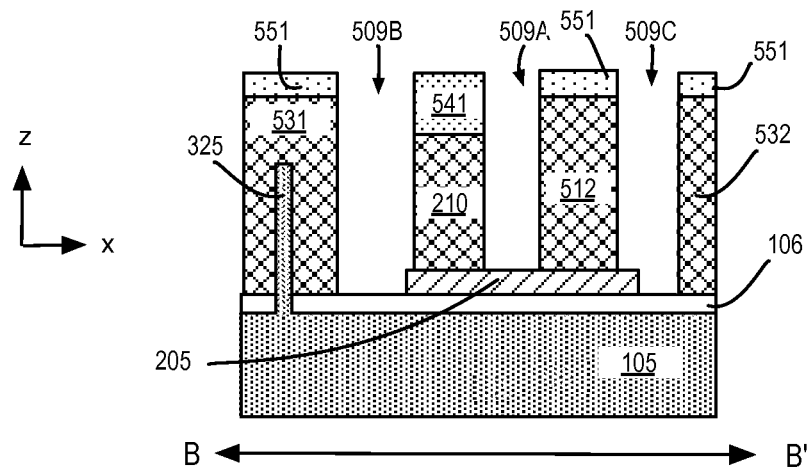

In FIG. 4B, method 402 continues with operation 409 where the resistive material is patterned to form a resistor pillar disposed over a first end of the conductive trace separate from resistive material disposed over the transistor semiconductor body, which may serve as a sacrificial gate electrode. Referring to FIG. 5D, openings 509A, 509B, and 509C are patterned through the z-height (thickness) of resistive material 510, with opening 509A exposing at least a portion of conductive trace 205 which will serve to isolate pillar resistor 210 from a subsequently formed contact to conductive trace 205. As further illustrated in FIG. 5D, an opening 509B further isolates conductive trace 205 and pillar resistor 210 from sacrificial gate 531 disposed over a channel portion of semiconductor body 325. Likewise, opening 509C further isolates conductive trace 205 from sacrificial gate 532. In one advantageous embodiment, a photolithographicly defined mask is utilized to pattern sacrificial gate 531 while the sacrificial fill material 541 is employed as a hardmask for a self-aligned pillar etch, thereby integrating the pillar resistor 210 into an existing gate-replacement process without incurring an additional mask layer and/or misregistration error. For example, a first edge of the opening 509A may delineate resistive material 210 without photolithography at operation 409, while a second edge of opening 509A delineating a sacrificial resistor pillar 512 may be the result of a photolithographic mask printed at operation 409. Likewise, opening 509B may have edges that are a union of previously-delineated hardmask 541, and a photolithographic mask printed at operation 409. Opening 509C may be completely delineated with photolithography at operation 409. Resistive material 510 may be etched into pillar 210, sacrificial pillar 512, and sacrificial gate 531 by any means known for the particular resistive material composition. In one example a plasma etch is utilized for patterning a resistive material of polysilicon.

Figure 5E:
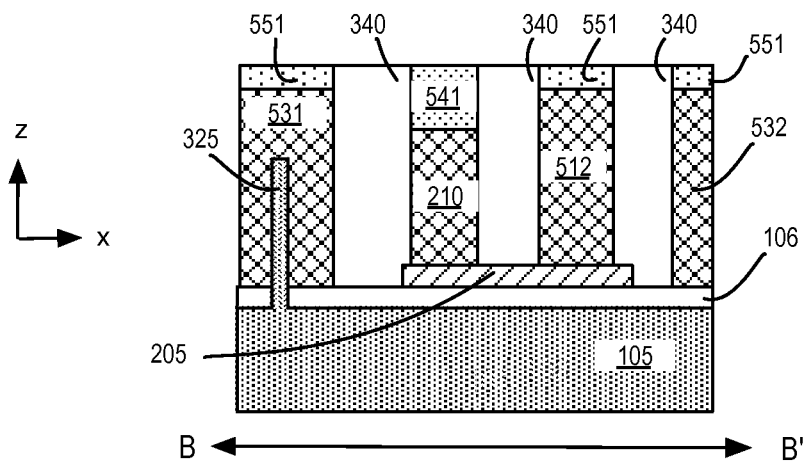
Figure 5F:
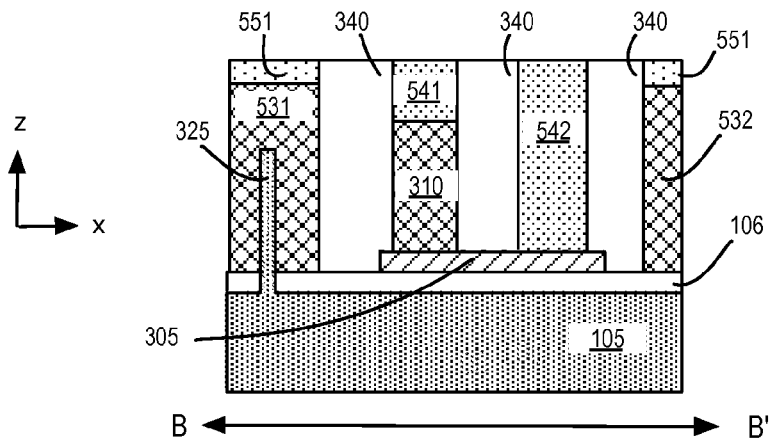
Figure 5G:
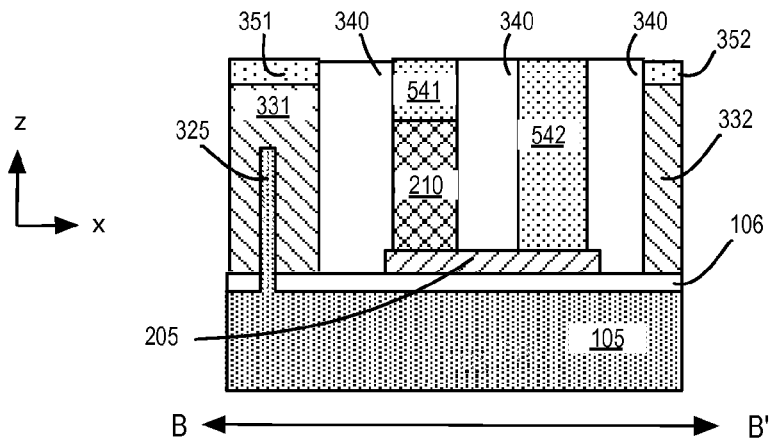
Figure 5H:
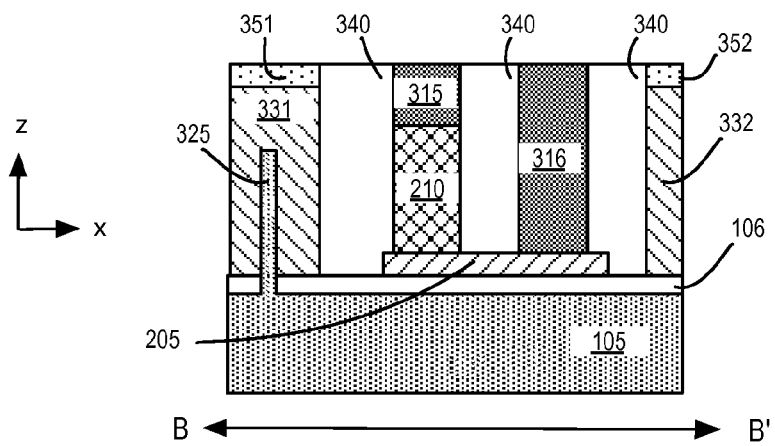

In FIG. 4B, method 402 continues with operation 411 where isolation dielectric is deposited around the vertical resistor pillar (and sacrificial gate) formed at operation 409. Any conventional dielectric deposition technique may be utilized at operation 411, such as, but not limited to CVD, ALD, and spin-on processes. In the exemplary embodiment further illustrated in FIG. 5E, isolation dielectric 340 is deposited over sacrificial gate 531 (and hardmask 551) and resistor pillar 210 (and sacrificial fill material 541). Isolation dielectric 340 may be any known dielectric material, such as a low-k dielectric (e.g., SiOC, etc.), or otherwise (e.g., SiCN, SiN, SiON, SiO). If isolation dielectric 340 is not deposited with a self-planarizing process, a planarization process may be performed subsequent to deposition to bring a top surface of isolation dielectric 340 substantially planar with hardmask 551 and sacrificial fill material 541, thereby exposing a top surface of both hardmask 551 and sacrificial fill material 541.

Returning to FIG. 4B, method 402 continues at operation 420 where resistive material remaining over a second end of the conductive trace is removed to expose an end of the conductive trace upon which a contact is to be landed. In the exemplary embodiment illustrated in FIG. 5E, a patterned etch of hardmask portion 551 is performed to expose sacrificial pillar 512 without exposing resistor pillar 210 or sacrificial gate 531, 532. Any patterning process may be utilized at operation 420, such as a photolithographic operation and a hardmask etch to expose resistive material 512. An etch selective to the resistive material (e.g., polysilicon) may then be utilized to remove sacrificial resistor pillar 512 from the surrounding isolation dielectric 340 in a self-aligned manner. As further illustrated in FIG. 5F, another sacrificial material is backfilled into the region where resistive material 512 was removed to form a sacrificial pillar 542. Sacrificial pillar 542 may be of any known material that may be subsequently removed with adequate selectively to isolation dielectric 340 such as, SiN, SiON, SiO, and the like. In one advantageous embodiment, sacrificial pillar 542 has the same material composition as sacrificial fill material 541.

Returning to FIG. 4B, method 402 continues with operation 425 where sacrificial resistive material disposed over the transistor semiconductor body is removed as a part of a replacement gate electrode process. The gate replacement process continues with backfilling the opening that resulted from removing the sacrificial resistive material. In the exemplary embodiment illustrated in FIGS. 5F and 5G, any known gate replacement process may be performed to replace sacrificial resistive material 531 with gate electrode 331, which is part of a gate stack further including a gate dielectric (not depicted) disposed between gate electrode 331 and semiconductor body 325. In one embodiment, the gate replacement process is performed in a self-aligned manner with hardmask 551 being removed without photolithographic patterning (e.g., with any known polish or other global etchback process, or through an etch known to be selective to hardmask 551 relative to isolation 340 and/or sacrificial fill material 541, and/or sacrificial pillar 542). Upon exposure of sacrificial resistive material 531 and 532, selective etching is utilized to expose the channel region of semiconductor body 325. Any known gate stack deposition process may then be utilized to form the gate stack. For example, a high-k gate material, such as $HfO_2$, metal silicate, or the like is deposited with any suitable deposition process, such as ALD. A gate electrode material, such as one or more workfunction metal and a fill metal, is deposited over the gate dielectric, and planarized with surrounding dielectrics to form gate electrodes 331, 332. A gate recess etch and capping process may be employed to form gate capping dielectric 351, 352.

Returning to FIG. 4B, at operation 440 the vertical resistor pillar is exposed, and a portion of the conductive trace is exposed in preparation for contact metallization. Contact metallization is then deposited at operation 450. In one advantageous embodiment, contact metallization of a pillar resistor is performed concurrently with contact metallization of a transistor source/drain. In a further embodiment, contact metallization of a pillar resistor is fully self-aligned to a top surface area of the resistor pillar. In the exemplary embodiment illustrated in FIG. 5H, resistor contacts 315 and 316 are formed concurrently with removing sacrificial fill material 541 (FIG. 5G) and sacrificial pillar 542 selectively to isolation dielectric 340 and backfilling with a desired contact metal. Recalling pillar 210 was etched with sacrificial fill material 541 as a mask, there is therefore no misregistration between contact metal 315 and vertical resistor pillar 210. The same contact metal may also be concurrently deposited onto a pair of semiconductor source/drain regions of semiconductor body 325 disposed on opposite sides of the semiconductor channel under gate electrode 331 (out of the z-x plane illustrated in FIG. 5H). Deposited contact metal may then be planarized with any known process to arrive at a transistor and pillar resistor with fully metallized terminals having top surfaces planar with each other.

Completing discussion of FIG. 4B, method 402 then ends at operation 455 with any conventional backend processing of the IC, for example by interconnecting at least one terminal of a transistor with at least one terminal of the pillar resistor.

Figure 6:
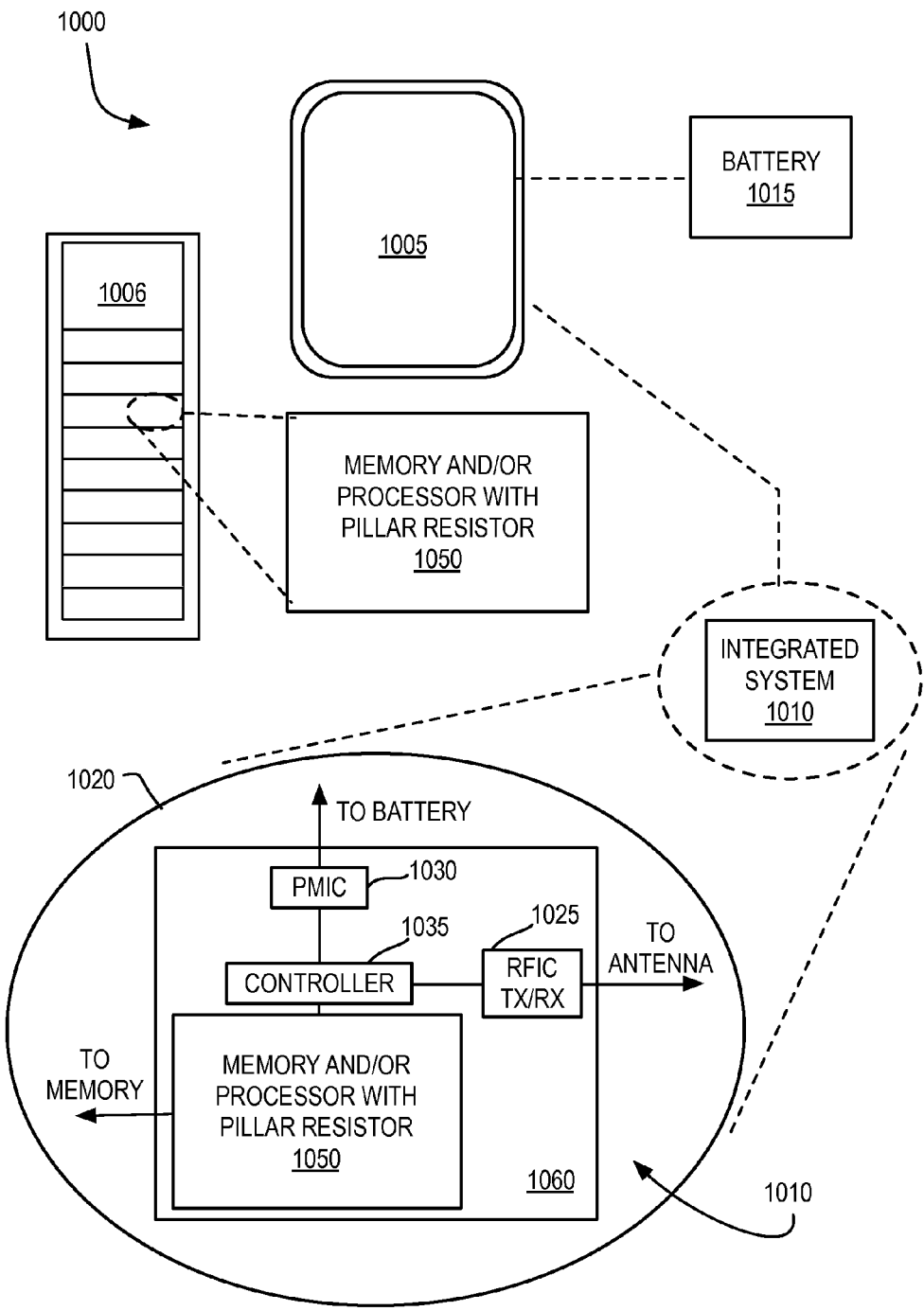
FIG. 6 illustrates a mobile computing platform and a data server machine employing an IC structure including a pillar resistor, in accordance with embodiments of the present invention.

FIG. 6 illustrates a system 1000 in which a mobile computing platform 1005 and/or a data server machine 1006 employs an IC structure including a vertical resistor pillar in accordance with one or more embodiment of the present invention. The server machine 1006 may be any commercial server, for example including any number of high-performance computing platforms disposed within a rack and networked together for electronic data processing, which in the exemplary embodiment includes a packaged monolithic IC 1050. The mobile computing platform 1005 may be any portable device configured for each of electronic data display, electronic data processing, wireless electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1010, and a battery 1015.

Whether disposed within the integrated system 1010 illustrated in the expanded view 1020, or as a stand-alone packaged chip within the server machine 1006, packaged monolithic IC 1050 includes a memory chip (e.g., RAM), or a processor chip (e.g., a microprocessor, a multi-core microprocessor, graphics processor, or the like) employing a vertical resistor pillar, for example as describe elsewhere herein. The monolithic IC 1050 may be further coupled to a board, a substrate, or integrated into a system-on-chip (SOC) 1060 along with, one or more of a power management integrated circuit (PMIC) 1030, RF (wireless) integrated circuit (RFIC) 1025 including a wideband RF (wireless) transmitter and/or receiver (TX/RX) (e.g., including a digital baseband and an analog front end module further comprises a power amplifier on a transmit path and a low noise amplifier on a receive path), and a controller thereof 1035.

Functionally, PMIC 1030 may perform battery power regulation, DC-to-DC conversion, etc., and so has an input coupled to battery 1015 and with an output providing a current supply coupled to other functional modules. As further illustrated, in the exemplary embodiment, RFIC 1025 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the monolithic IC 1050 or within a single IC coupled to the package substrate of the monolithic IC 1050. In particular embodiments, at least one of a processor IC, memory IC, RFIC, or PMIC includes logic circuitry that incorporates a pillar resistor, and/or a transistor and pillar resistor structure, having one or more of the structural features described elsewhere herein.

Figure 7:
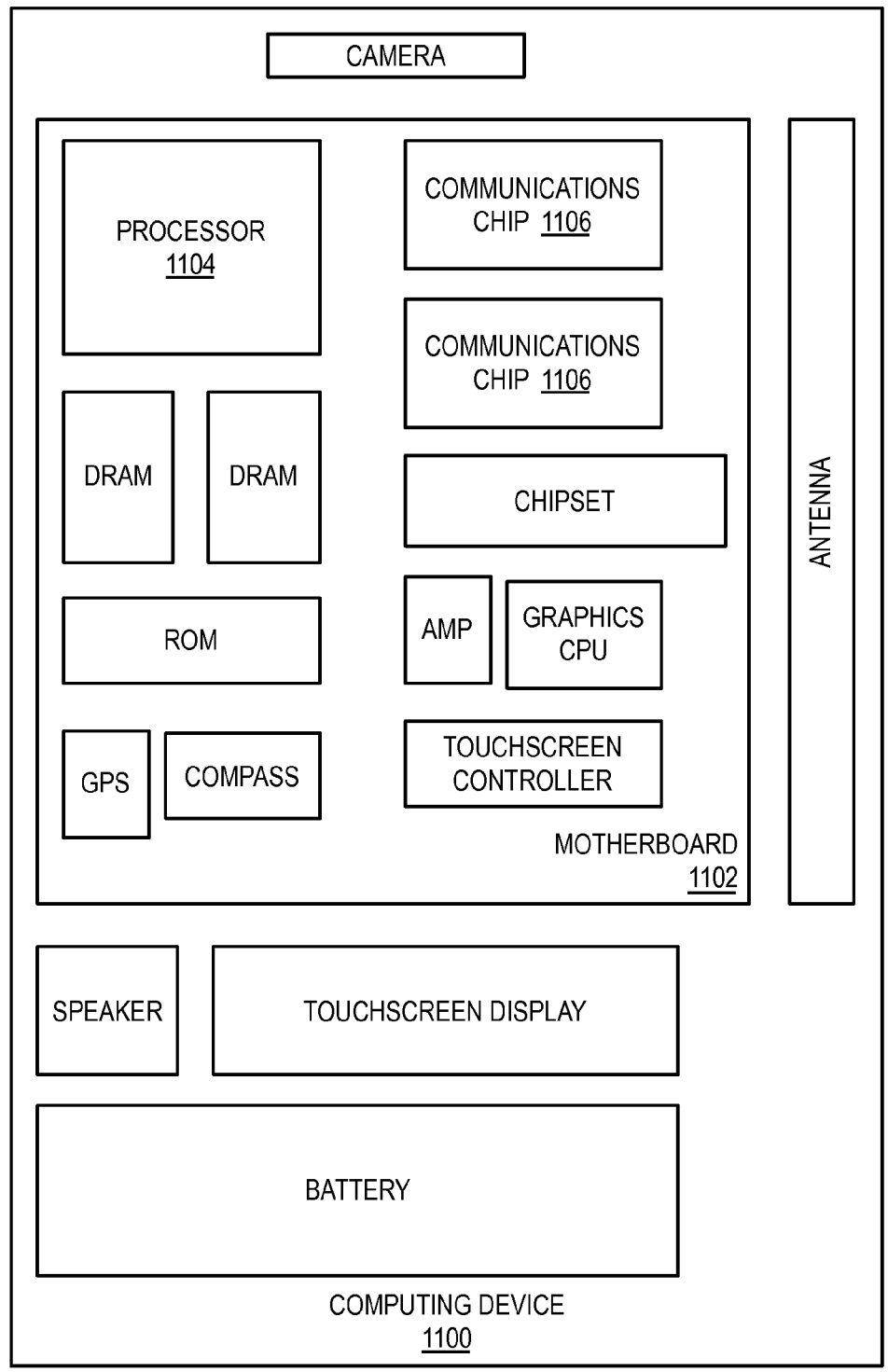
FIG. 7 is a functional block diagram of an electronic computing device, in accordance with an embodiment of the present invention.

FIG. 7 is a functional block diagram of a computing device 1100, arranged in accordance with at least some implementations of the present disclosure. Computing device 1100 may be found inside platform 1005 or server machine 1006, for example. Device 1100 further includes a motherboard 1102 hosting a number of components, such as, but not limited to, a processor 1104 (e.g., an applications processor), which may further incorporate a pillar resistor structure, and/or a transistor and pillar resistor structure, in accordance with one or more embodiments of the present invention. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. The above embodiments may include specific combination of features. For example:

In one or more first embodiment, an integrated circuit (IC) structure, comprises a conductive trace extending laterally over a substrate. The IC structure further includes a pillar of resistive material in contact with a first end of the conductive trace, the pillar extending a first z-height from the first end that is greater than a lateral length of the pillar interfacing with the conductive trace. The IC structure further includes a first resistor contact disposed in contact with the pillar. The IC structure further includes a second resistor contact disposed in contact with a second end of the conductive trace.

In furtherance of the one or more first embodiment, the electrical resistance of the pillar is more than twice the cumulative sum of the conductive trace resistance, first resistor contact resistance, and second resistor contact resistance.

In furtherance of the one or more first embodiment, the conductive trace comprises a first material having a second z-height and a lateral length that is less than the first z-height, but greater than the sum of the lateral length of the pillar and a lateral length of the second resistor contact.

In furtherance of the embodiment immediately above, the second resistor contact has a third z-height from the second end of the conductive trace that is substantially equal to the sum of the first z-height and a fourth z-height of the first resistor contact.

In furtherance of the one or more first embodiment, first resistor contact interfaces with the entire top surface of the pillar and has a lateral length substantially equal to the lateral length of the pillar interfacing with the conductive trace.

In furtherance of the one or more first embodiment, the pillar and the conductive trace comprise polysilicon, the conductive trace doped to a higher impurity concentration that the pillar.

In furtherance of any one of the above embodiments, the IC structure further comprises a transistor disposed over the substrate and adjacent to the pillar. The transistor further comprises a gate stack disposed over a semiconductor channel, the gate stack including a gate electrode disposed over a gate dielectric. The transistor further comprises a pair of semiconductor source/drains disposed on opposite sides of the semiconductor channel. The transistor further comprises a pair of source/drain contacts disposed on the pair of semiconductor source/drains. The conductive trace comprises a first material having a second z-height. The gate electrode extends a z-height, from a surface of an isolation dielectric disposed over the substrate, greater than the sum of the first z-height and the second z-height.

In furtherance of the embodiment immediately above, the second resistor contact has a third z-height from the second end of the conductive trace that is approximately equal to the sum of the first z-height and a fourth z-height of the first resistor contact.

In furtherance of the one or more first embodiment, the IC structure further comprises a transistor disposed over the substrate and adjacent to the pillar. The transistor further comprises a gate stack disposed over a semiconductor channel, the gate stack including a gate electrode disposed over a gate dielectric. The transistor further comprises a pair of semiconductor source/drains disposed on opposite sides of the semiconductor channel. The transistor further comprises a pair of source/drain contacts disposed on the pair of semiconductor source/drains, wherein the pair of source/drain contacts have substantially the same composition as the first and second resistor contacts.

In furtherance of the one or more first embodiment, the IC structure further comprises a transistor disposed over the substrate and adjacent to the pillar. The transistor further comprises a gate stack disposed over a semiconductor channel, the gate stack including a gate electrode disposed over a gate dielectric. The transistor further comprises a pair of semiconductor source/drains disposed on opposite sides of the semiconductor channel. The transistor further comprises a pair of source/drain contacts disposed on the pair of semiconductor source/drains. The transistor further comprises an isolation dielectric surrounding the pillar and first resistor contact, the isolation dielectric laterally separating the pillar from the gate electrode and from the second resistor contact.

In furtherance of any of the embodiments above, the first z-height is 50-200 nm. A lateral length of the pillar is no more than 25 nm. A lateral length of the second resistor contact is no more than 25 nm. The conductive trace comprises doped polysilicon having a lateral length that is between the first z-height and the sum of the lateral length of the pillar and a lateral length of the second resistor contact.

In one or more second embodiment, a system on a chip (SOC) comprises processor logic circuitry. The SOC comprises memory circuitry coupled to the processor logic circuitry. The SOC comprises RF circuitry coupled to the processor logic circuitry and including radio transmission circuitry and radio receiver circuitry. The SOC comprises power management circuitry including an input to receive a DC power supply and an output coupled to at least one of the processor logic circuitry, memory circuitry, and RF circuitry, wherein at least one of the processor logic circuitry, memory circuitry, RF circuitry, or power management circuitry include the integrated circuit (IC) structure of any one of the above claims.

In furtherance of the one or more second embodiment, the electrical resistance of the pillar is at least 2000Ω, and more than twice the cumulative sum of the conductive trace resistance, first resistor contact resistance, and second resistor contact resistance.

In one or more third embodiment, a method of fabricating an integrated circuit (IC) structure comprises forming a conductive trace extending laterally over a substrate. The method further comprises forming a resistor pillar on a first end of the conductive trace. The method further comprises forming a first resistor contact disposed on the pillar. The method further comprises forming a second resistor contact disposed on a second end of the conductive trace.

In furtherance of the one or more third embodiment, forming the conductive trace further comprises depositing a conductive film over the substrate and patterning the conductive film into the trace. Forming the resistor pillar on a first end of the conductive trace further comprises depositing a resistive material over the trace. Forming the resistor pillar further comprises patterning a recess in the resistive material over the first end of the conductive trace. Forming the resistor pillar further comprises backfilling recess with a sacrificial fill material. Forming the resistor pillar further comprises patterning the resistive material to form the pillar aligned with the sacrificial fill material.

In furtherance of the embodiment immediately above, forming the first resistor contact further comprises depositing an isolation dielectric around the resistor pillar. Forming the first resistor contact further comprises removing the sacrificial fill material selectively to the isolation dielectric to expose the pillar. Forming the first resistor contact further comprises depositing a contact metal onto the exposed resistor pillar. Forming the second resistor contact further comprises patterning the resistive material to form a sacrificial pillar disposed over the second end of the conductive trace concurrently with patterning the resistor pillar. Forming the second resistor contact further comprises removing the sacrificial pillar selectively to the isolation dielectric to form a via landing on the second end of the conductive trace. Forming the second resistor contact further comprises depositing the contact metal onto an exposed end of the conductive trace concurrently with depositing the contact metal onto the exposed resistor pillar.

In furtherance of the embodiment above, the method further comprises forming a transistor over the substrate adjacent to the resistor pillar. Forming the transistor further comprises forming a semiconductor channel region. Forming the transistor further comprises forming a gate stack disposed over the semiconductor channel, the gate stack including a gate electrode disposed over a gate dielectric. Forming the transistor further comprises forming a pair of semiconductor source/drains disposed on opposite sides of the semiconductor channel Forming the transistor further comprises forming a pair of source/drain contacts disposed on the pair of semiconductor source/drains. Forming the pair of source/drain contacts further comprises depositing the contact metal onto the semiconductor source/drains concurrently with depositing the contact metal onto the exposed resistor pillar.

In furtherance of the embodiment immediately above, the method further comprises forming a transistor over the substrate adjacent to the resistor pillar. Forming the transistor further comprises forming a semiconductor channel region. Forming the transistor further comprises forming a gate stack disposed over the semiconductor channel, the gate stack including a gate electrode disposed over a gate dielectric. Forming the gate stack further comprises depositing the resistive material over the semiconductor channel Forming the gate stack further comprises patterning the resistive material over the semiconductor channel into sacrificial gate. Forming the gate stack further comprises removing the sacrificial gate after depositing the isolation oxide around the resistor pillar and around the sacrificial gate. Forming the gate stack further comprises forming a pair of semiconductor source/drains disposed on opposite sides of the semiconductor channel Forming the gate stack further comprises forming a pair of source/drain contacts disposed on the pair of semiconductor source/drains.

In furtherance of any of the third embodiments above, depositing the conductive film over the substrate further comprises depositing an impurity doped polysilicon film over the substrate. Depositing the resistive material over the trace further comprises depositing a more lightly doped polysilicon film over the doped polysilicon film.

In furtherance of any of the third embodiments above, depositing the conductive film over the substrate further comprises depositing an impurity doped polysilicon film over the substrate. Depositing the resistive material over the trace further comprises depositing a more lightly doped polysilicon film over the doped polysilicon film. Forming the first resistor contact disposed on the pillar further comprises backfilling a first recess self-aligned to the pillar with contact metal. Forming the second resistor contact disposed on a second end of the conductive trace further comprises backfilling a second recess approximately equal in z-height to the sum of the first resistor contact and pillar with the contact metal.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) structure, comprising:
   a conductive trace extending laterally over a substrate;
   a pillar of resistive material in contact with a first end of the conductive trace, the pillar of resistive material extending a first z-height from the first end of the conductive trace that is greater than a lateral length of the pillar of resistive material interfacing with the conductive trace;
   a first resistor contact disposed in contact with the pillar of resistive material; and
   a second resistor contact disposed in contact with a second end of the conductive trace, wherein electrical resistance of the pillar of resistive material is more than twice a cumulative sum of conductive trace resistance, first resistor contact resistance, and second resistor contact resistance.

2. The IC structure of claim 1, wherein the conductive trace comprises a first material having a second z-height and a lateral length that is less than the first z-height, but greater than a sum of the lateral length of the pillar of resistive material and a lateral length of the second resistor contact.

3. The IC structure of claim 2, wherein the second resistor contact has a third z-height from the second end of the conductive trace that is substantially equal to a sum of the first z-height and a fourth z-height of the first resistor contact.

4. The IC structure of claim 1, wherein the first resistor contact interfaces with an entire top surface of the pillar of resistive material and has a lateral length substantially equal to the lateral length of the pillar of resistive material interfacing with the conductive trace.

5. The IC structure of claim 1, wherein the pillar of resistive material and the conductive trace comprise polysilicon, the conductive trace is doped to a higher impurity concentration that the pillar of resistive material.

6. The IC structure of claim 1, further comprising a transistor disposed over the substrate and adjacent to the pillar of resistive material, the transistor further comprising:
a gate stack disposed over a semiconductor channel, the gate stack including a gate electrode disposed over a gate dielectric;
a pair of semiconductor source/drains disposed on opposite sides of the semiconductor channel; and
a pair of source/drain contacts disposed on the pair of semiconductor source/drains; and wherein:
the conductive trace comprises a first material having a second z-height; and
the gate electrode extends a z-height, from a surface of an isolation dielectric disposed over the substrate, greater than sum of the first z-height and the second z-height.

7. The IC structure of claim 6, wherein the second resistor contact has a third z-height from the second end of the conductive trace that is approximately equal to sum of the first z-height and a fourth z-height of the first resistor contact.

8. The IC structure of claim 1, further comprising a transistor disposed over the substrate and adjacent to the pillar of resistive material, the transistor further comprising:
a gate stack disposed over a semiconductor channel, the gate stack including a gate electrode disposed over a gate dielectric;
a pair of semiconductor source/drains disposed on opposite sides of the semiconductor channel; and
a pair of source/drain contacts disposed on the pair of semiconductor source/drains,
wherein the pair of source/drain contacts have substantially same composition as the first and second resistor contacts.

9. The IC structure of claim 1, further comprising:
a transistor disposed over the substrate and adjacent to the pillar of resistive material, the transistor further comprising:
a gate stack disposed over a semiconductor channel, the gate stack including a gate electrode disposed over a gate dielectric;
a pair of semiconductor source/drains disposed on opposite sides of the semiconductor channel; and
a pair of source/drain contacts disposed on the pair of semiconductor source/drains; and an isolation dielectric surrounding the pillar of resistive material and the first resistor contact, the isolation dielectric laterally separating the pillar of resistive material from the gate electrode and from the second resistor contact.

10. The IC structure of claim 1, wherein:
the first z-height is 50-200 nm;
a lateral length of the pillar of resistive material is no more than 25 nm;
a lateral length of the second resistor contact is no more than 25 nm; and the conductive trace comprises doped polysilicon having a lateral length that is between the first z-height and a sum of the lateral length of the pillar of resistive material and a lateral length of the second resistor contact.

11. A method of fabricating an integrated circuit (IC) structure, the method comprising:
forming a conductive trace extending laterally over a substrate;
forming a resistor pillar on a first end of the conductive trace;
forming a first resistor contact disposed on the resistor pillar; and
forming a second resistor contact disposed on a second end of the conductive trace, wherein: forming the conductive trace further comprises depositing a conductive film over the substrate and patterning the conductive film into the conductive trace;
forming the resistor pillar on a first end of the conductive trace further comprises:
depositing a resistive material over the conductive trace;
patterning a recess in the resistive material over the first end of the conductive trace;
backfilling the recess with a sacrificial fill material; and
patterning the resistive material to form the resistor pillar aligned with the sacrificial fill material.

12. The method of claim 11, wherein:
forming the first resistor contact further comprises:
depositing an isolation dielectric around the resistor pillar;
removing the sacrificial fill material to expose the resistor pillar; and
depositing a contact metal onto the exposed resistor pillar; and
forming the second resistor contact further comprises:
patterning the resistive material to form a sacrificial pillar disposed over the second end of the conductive trace;
removing the sacrificial pillar selectively to the isolation dielectric to form a via landing on the second end of the conductive trace;
depositing the contact metal onto an exposed end of the conductive trace concurrently with depositing the contact metal onto the exposed resistor pillar.

13. The method of claim 11, further comprising
forming a transistor over the substrate adjacent to the resistor pillar, wherein forming the transistor further comprises:
forming a semiconductor channel region;
forming a gate stack disposed over the semiconductor channel, the gate stack including a gate electrode disposed over a gate dielectric;
forming a pair of semiconductor source/drains disposed on opposite sides of the semiconductor channel; and
forming a pair of source/drain contacts disposed on the pair of semiconductor source/drains,
wherein forming the pair of source/drain contacts further comprises:
depositing the contact metal onto the semiconductor source/drains concurrently with depositing the contact metal onto the exposed resistor pillar.

14. The method of claim 12, further comprising forming a transistor over the substrate adjacent to the resistor pillar, wherein forming the transistor further comprises:
forming a semiconductor channel region;
forming a gate stack disposed over the semiconductor channel, the gate stack including a gate electrode disposed over a gate dielectric, wherein forming the gate stack further comprises:

depositing the resistive material over the semiconductor channel;
patterning the resistive material over the semiconductor channel into sacrificial gate;
removing the sacrificial gate after depositing the isolation oxide around the resistor pillar and around the sacrificial gate;
forming a pair of semiconductor source/drains disposed on opposite sides of the semiconductor channel; and
forming a pair of source/drain contacts disposed on the pair of semiconductor source/drains.

15. The method of claim 11, wherein:
depositing the conductive film over the substrate further comprises depositing an impurity doped polysilicon film over the substrate; and
depositing the resistive material over the conductive trace further comprises depositing a more lightly doped polysilicon film over the doped polysilicon film.

16. The method of claim 11, wherein:
depositing the conductive film over the substrate further comprises depositing an impurity doped polysilicon film over the substrate;
depositing the resistive material over the conductive trace further comprises depositing a more lightly doped polysilicon film over the doped polysilicon film;
forming the first resistor contact disposed on the resistor pillar further comprises backfilling a first recess self-aligned to the resistor pillar with the contact metal; and
forming the second resistor contact disposed on a second end of the conductive trace further comprises backfilling a second recess approximately equal in z-height to sum of the first resistor contact and the resistor pillar with the contact metal.

17. A system on a chip (SOC), comprising: processor logic circuitry;
memory circuitry coupled to the processor logic circuitry;
RF circuitry coupled to the processor logic circuitry and including radio transmission circuitry and radio receiver circuitry; and
power management circuitry including an input to receive a DC power supply and an output coupled to at least one of the processor logic circuitry, memory circuitry, and RF circuitry, wherein at least one of the processor logic circuitry, memory circuitry, RF circuitry, or power management circuitry include an integrated circuit (IC) structure,
comprising:
a conductive trace extending laterally over a substrate;
a pillar of resistive material in contact with a first end of the conductive trace, the pillar of resistive material extending a first z-height from the first end of the conductive trace that is greater than a lateral length of the pillar of resistive material interfacing with the conductive trace;
a first resistor contact disposed in contact with the pillar of resistive material and separated from the conductive trace by a first thickness; and
a second resistor contact disposed in contact with a second end of the conductive trace, wherein electrical resistance of the pillar of resistive material is at least 2000Ω and more than twice a cumulative sum of conductive trace resistance, first resistor contact resistance, and second resistor contact resistance.

* * * * *